United States Patent
Park et al.

(10) Patent No.: US 7,821,825 B2
(45) Date of Patent: *Oct. 26, 2010

(54) NAND FLASH MEMORY DEVICES HAVING SHIELDING LINES BETWEEN WORDLINES AND SELECTION LINES

(75) Inventors: Ki-Tae Park, Gyeonggi-do (KR); Jung-Dal Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/358,009

(22) Filed: Jan. 22, 2009

(65) Prior Publication Data

US 2009/0135647 A1 May 28, 2009

Related U.S. Application Data

(63) Continuation of application No. 11/432,072, filed on May 11, 2006, now Pat. No. 7,486,554.

(30) Foreign Application Priority Data

May 11, 2005  (KR) ...................... 10-2005-0039433

(51) Int. Cl.
*G11C 16/04* (2006.01)
(52) U.S. Cl. ............................ 365/185.02; 365/185.19; 365/185.17
(58) Field of Classification Search ............ 365/185.02, 365/185.19, 185.17
See application file for complete search history.

(56) References Cited

U.S. PATENT DOCUMENTS

| | | | |
|---|---|---|---|
| 6,046,935 | A | 4/2000 | Takeuchi et al. |
| 6,151,249 | A | 11/2000 | Shirota et al. |
| 6,373,746 | B1 * | 4/2002 | Takeuchi et al. ....... 365/185.03 |
| 6,845,042 | B2 | 1/2005 | Ichige et al. |
| 7,079,437 | B2 | 7/2006 | Hazama et al. |
| 7,239,556 | B2 | 7/2007 | Abe et al. |
| 7,272,049 | B2 | 9/2007 | Kang et al. |
| 7,301,815 | B2 | 11/2007 | Kurata et al. |
| 7,310,280 | B2 | 12/2007 | Park et al. |
| 2005/0180186 | A1 | 8/2005 | Lutze et al. |
| 2006/0239077 | A1 | 10/2006 | Park et al. |
| 2007/0147119 | A1 | 6/2007 | Pham et al. |

FOREIGN PATENT DOCUMENTS

KR   10-1998-025698   7/1998

\* cited by examiner

*Primary Examiner*—Huan Hoang
(74) *Attorney, Agent, or Firm*—Myers Bigel Sibley & Sajovec, P.A.

(57) ABSTRACT

A method of programming a flash memory includes applying a shielding voltage to at least one shielding line, which is interposed between a plurality of wordlines and a selection line and operable to reduce capacitance-coupling between the wordline and the selection line during the programming operation, and applying a program voltage to memory cells through one of the wordlines.

10 Claims, 9 Drawing Sheets

Fig. 1

(Prior Art)

Fig. 2

(Prior Art)

NAND FLASH MEMORY DEVICES HAVING SHIELDING LINES BETWEEN WORDLINES AND SELECTION LINES

CROSS-REFERENCE TO RELATED APPLICATION

This application is a continuation of U.S. patent application Ser. No. 11/432,072, filed on May 11, 2006, which issued as U.S. Pat. No. 7,486,554 and which claims priority from Korean Patent Application 2005-39433 filed on May 11, 2005, the disclosures of which are incorporated herein by reference in their entireties.

BACKGROUND

The present invention relates to semiconductor memory devices, and, in particular relates to NAND flash memory devices.

Semiconductor memory devices are storage units that may be capable of storing data and providing data in response to requests therefor. These semiconductor memory devices are generally divided into random-access memories (RAMs) and read-only memories (ROMs). RAMs may be volatile memories that lose data when a power supply is absent, while ROMs may be nonvolatile memories that keep data even without a power supply. RAMs may include dynamic and static types. ROMs are usually classified into programmable ROMs (PROMs), erasable PROMs (EPROMs), electrically EPROMs, and flash memories. The flash memories may be divided into NOR and NAND types.

Figure 1:
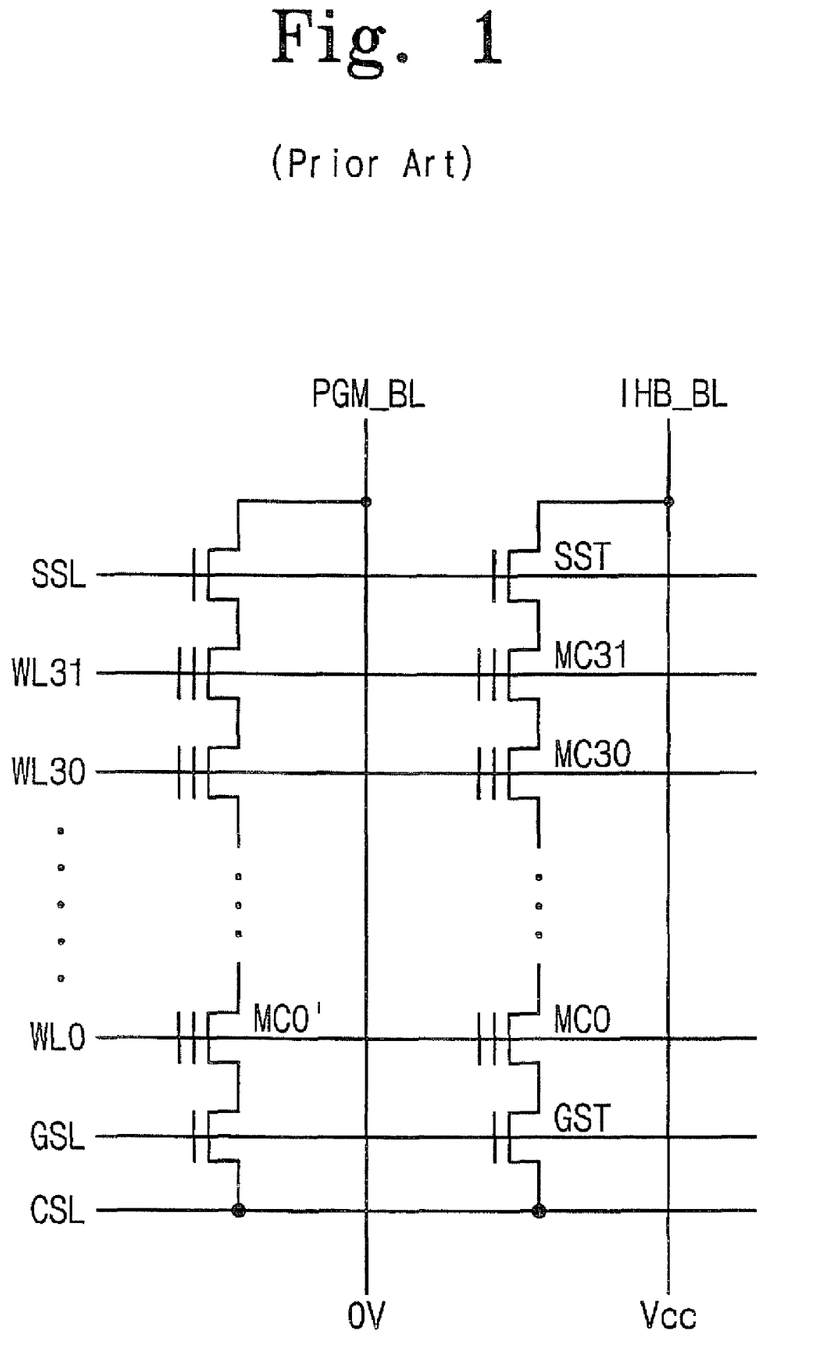
FIG. 1 is a circuit diagram showing the structure of a cell string in a conventional NAND flash memory device.

FIG. 1 is a circuit diagram showing the structure of a cell string in a conventional NAND flash memory device. As illustrated in FIG. 1, a cell string is composed of a ground selection transistor GST, a string selection transistor SST, and pluralities of memory cells MC0~MC31 serially connected between the ground and string selection transistors GST and SST. The ground selection transistor GST is connected to a common source line CSL while the string selection transistor SST is connected to a bitline BL.

Wordlines WL0~WL31 are each coupled to gates of the memory cells MC0~MC31 so as to apply wordline voltages thereto. The gate of the string selection transistor SST is coupled to a string selection line SSL while the gate of the ground selection transistor GST is coupled to a ground selection line GSL.

A voltage of 0V is applied to a bitline PGM_BL that is connected to a memory cell to be programmed (hereinafter, referred to as "program cell"), while a power source voltage Vcc is applied to a bitline IHB_BL that is connected to a memory cell not to be programmed (hereinafter, referred to as "program-inhibited cell").

Assuming an intention to program the memory cells MC0' and MC0, which are coupled to the wordline WL0 adjacent to the ground selection line GSL, a program voltage Vpgm is applied to the selected wordline WL0 and a pass voltage Vpass is applied to deselected wordlines WL1~WL31 during a programming operation. During this operation, the program cell MC0' has a threshold voltage corresponding to data '0' and the program-inhibited cell MC0 has a threshold voltage corresponding to data '1' as an erased state.

Figure 2:
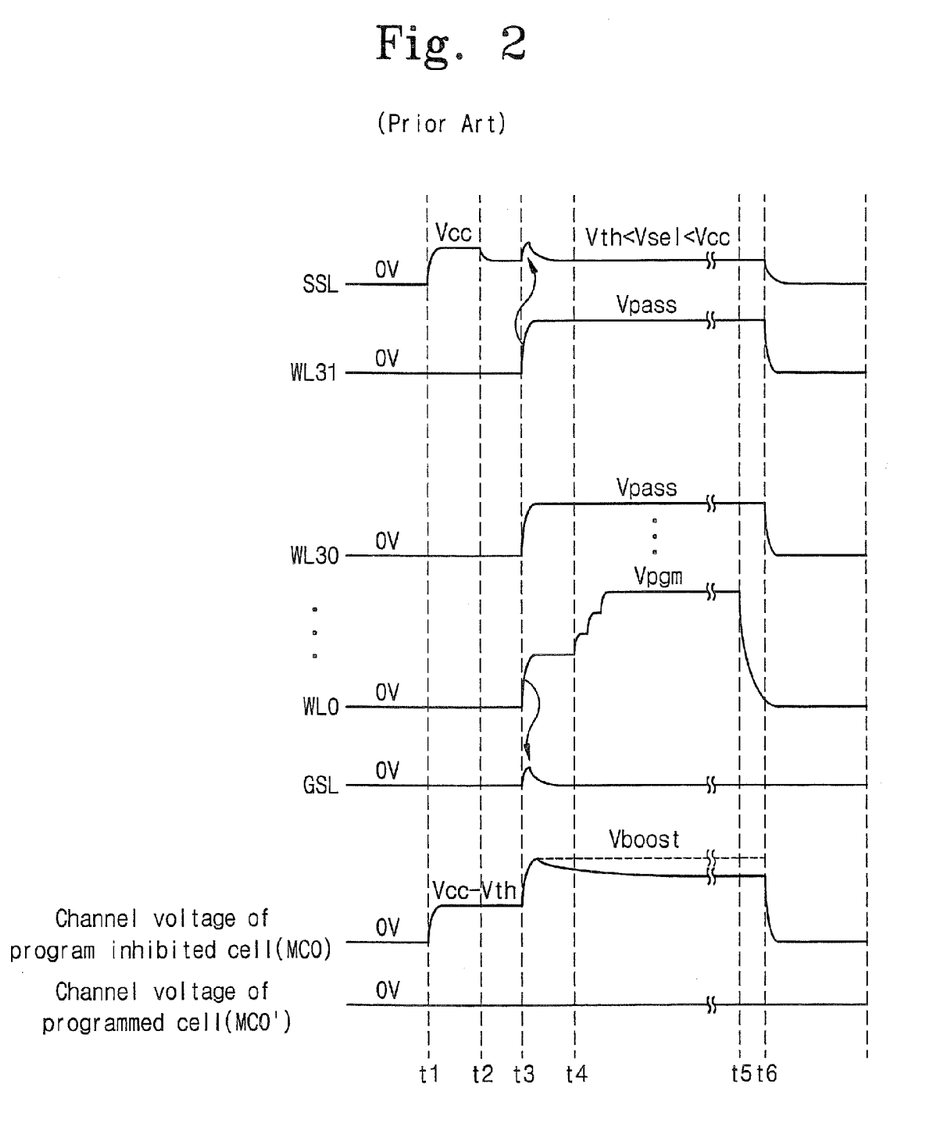
FIG. 2 is a timing diagram showing bias conditions for a programming operation for the cell string of the NAND flash memory device shown in FIG. 1.

FIG. 2 is a timing diagram showing bias conditions for a programming operation for the cell string of the NAND flash memory device shown in FIG. 1, which depicts variations of channel voltages in the program cell MC0' and the program-inhibited cell MC0 during the programming operation.

When the programming operation begins, the bitline PGM_BL of the program cell MC0' is set to 0V while the bitline IHB_BL of the program-inhibited cell MC0 is set to the power supply voltage Vcc.

The power source voltage Vcc is applied to the string selection line SSL at time point $t_1$. At this time, a channel voltage of the program-inhibited cell MC0 is Vcc–Vth. Here, Vth represents a threshold voltage of the string selection transistor SST. As a result, the string selection transistor SST cuts off.

At time point $t_2$, the voltage being applied to the string selection line SSL transitions to a voltage Vsel that is greater than the threshold voltage Vth but less than the power source voltage Vcc, which forces the string selection transistor SST to be driven heavily into a cut-off state.

At time point $t_3$, a high voltage of about 8V, which is the pass voltage Vpass, is applied to the selected wordline WL0 and the deselected wordlines WL1~WL31. If the pass voltage Vpass is applied to the gate of the program-inhibited cell MC0 through the selected wordline WL0, capacitance-coupling between the channel and gate of the program-inhibited cell MC0 may be generated. The capacitance-coupling may boost the channel voltage, which is called a self-boosting effect. The boosted channel voltage may prevent the F-N tunneling effect from being induced in the program-inhibited cell MC0.

However, as shown in FIG. 2, when the pass voltage Vpass is being applied to the wordlines WL0~WL31, voltages on the ground and string selection lines GSL and SSL instantly rise because there is a line capacitance-coupling effect between the selected wordline WL0 and the ground selection line GSL or between the wordline WL31 and the string selection line SSL.

The voltages on the ground and string selection lines GSL and SSL instantly rise due to the line capacitance-coupling effect. If the voltages on the ground and string selection lines GSL and SSL are slightly raised, then the ground selection transistor GST or the string selection transistor SST is instantly turned on, thereby failing to maintain its cut-off state. During this operation, the channel voltage Vboost of the program-inhibited cell MC0, which has been raised by the self-boosting effect, leaks out through the ground selection transistor GST or the string selection transistor SST. Thus, as shown in FIG. 2, the channel voltage Vboost of the program-inhibited cell MC0 becomes lower.

At time point $t_4$, when the program voltage Vpgm is applied to the selected wordline WL0, electrons staying at the channel are injected into the floating gate in the program cell MC0'. But, in the program-inhibited cell MC0', electrons should not be injected into the floating gate from the channel because there is no generation of the F-N tunneling effect.

However, as shown in FIG. 2, the decreased channel voltage of the program-inhibited cell MC0 may induce the F-N tunneling effect therein. Namely, the program-inhibited cell MC0 is inadvertently programmed thereby. Such a result causes degradation of a distribution profile for programmed threshold voltages of memory cells. The distribution profile for programmed threshold voltages may be highly important for multi-level memory cells each storing multiple data bits. Thus, the channel-voltage leakage due to the capacitance-coupling effect between the wordline and selection lines may become more serious in programming multiple data bits.

SUMMARY

According to some embodiments of the present invention, a method of programming a flash memory includes applying a shielding voltage to at least one shielding line, which is interposed between a plurality of wordlines and a selection line and operable to reduce capacitance-coupling between the wordline and the selection line during the programming operation, and applying a program voltage to memory cells through one of the wordlines.

In other embodiments, the shielding voltage is between about 0V and a pass voltage.

In still other embodiments, the shielding voltage is a step voltage.

In still other embodiments, the program voltage is applied to one of the wordlines when the shielding voltage is about equal to the pass voltage.

In still other embodiments, the shielding voltage is applied to the shielding line when a selection voltage is supplied to the selection line.

In still other embodiments, an interval between adjacent ones of the plurality of wordlines is about a same as an interval between the wordline and the shielding line, and about a same as an interval between the shielding line and the selection line.

In still other embodiments, the selection line is a string selection line.

In still other embodiments, the selection line is a ground selection line.

In still other embodiments, the shielding line comprises a conductive material.

In further embodiments of the present invention, a method of programming a flash memory includes applying a shielding voltage to at least one shielding line interposed between a plurality of wordlines and a selection line and applying a program voltage to memory cells through one of the wordlines, wherein the shielding voltage is a step voltage.

BRIEF DESCRIPTION OF THE FIGURES

The accompanying drawings are included to provide a further understanding of the invention, and are incorporated in and constitute a part of this specification. The drawings illustrate example embodiments of the invention and, together with the description, serve to explain principles of the present invention. In the drawings.

DETAILED DESCRIPTION OF EMBODIMENTS

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

Figure 3:
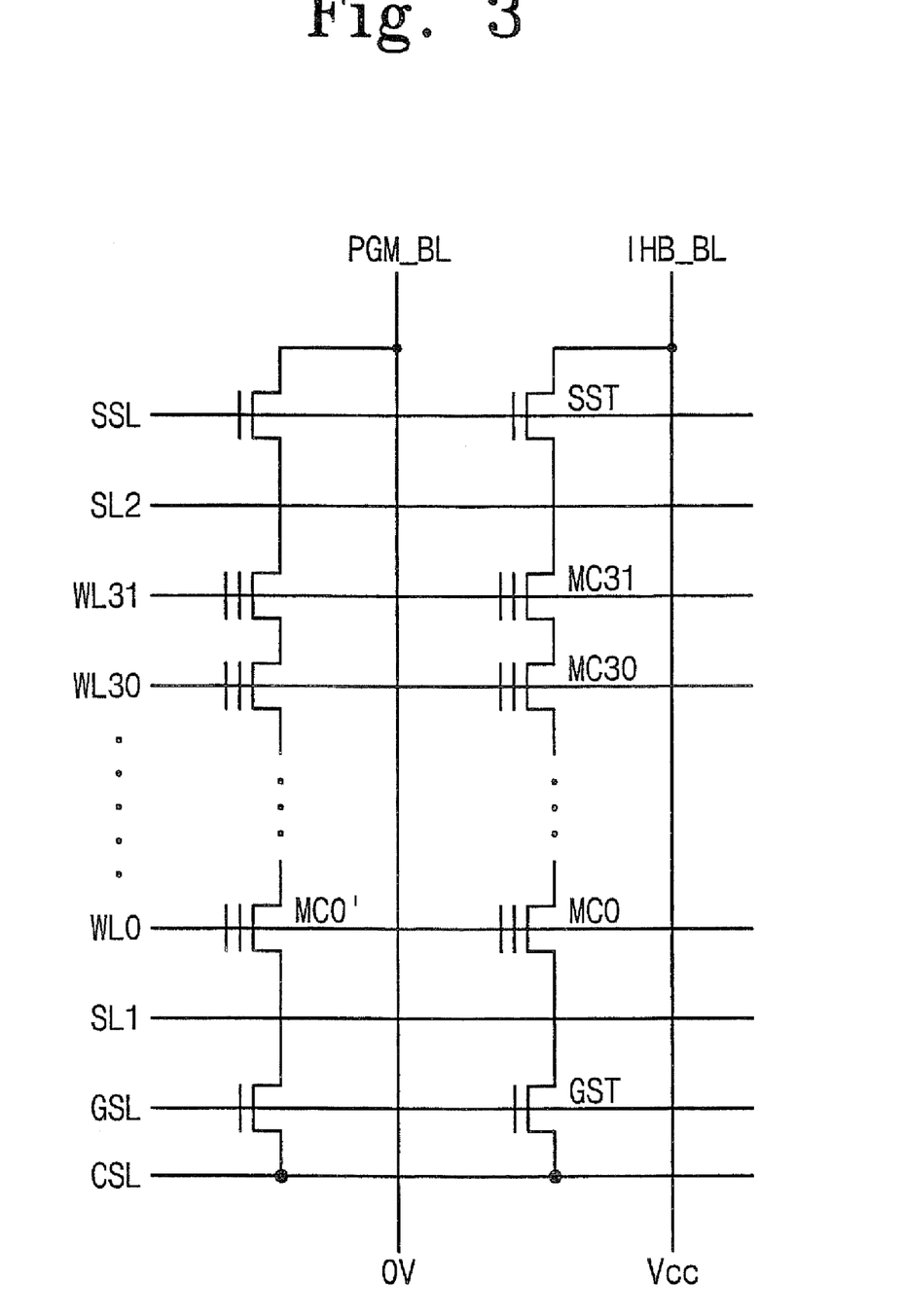
FIG. 3 is a circuit diagram illustrating the structure of a cell string in a NAND flash memory device in accordance with first embodiments of the present invention.

FIG. 3 is a circuit diagram illustrating the structure of a cell string in a NAND flash memory device in accordance with first embodiments of the present invention. The cell string is composed of a ground selection transistor GST, a string selection transistor SST, and a plurality of memory cells MC0~MC31 serially connected between the ground and string selection transistors GST and SST. The ground selection transistor GST is connected to a common source line CSL while the string selection transistor SST is connected to a bitline BL.

Wordlines WL0~WL31 are each coupled to gates of the memory cells MC0~MC31 so as to apply wordline voltages thereto. Here, the wordline voltages include a program voltage Vpgm and a pass voltage Vpass that are applied thereto in a programming operation. The gate of the string selection transistor SST is coupled to a string selection line SSL while the gate of the ground selection transistor GST is coupled to a ground selection line GSL.

During the programming operation, a voltage of 0V is applied to a bitline PGM_BL that is connected to a program cell (e.g., MC0'), while a power source voltage Vcc is applied to a bitline IHB_BL that is connected to a program-inhibited cell (e.g., MC0). The program voltage Vpgm is applied to a selected wordline (e.g., WL0), while the pass voltage Vpass is applied to deselected wordlines WL1~WL31.

Referring to FIG. 3, the cell string of the NAND flash memory device, according to some embodiments of the invention, is comprised of shielding lines SL1 and SL2 between the wordline WL0 and the ground selection line GSL and between the wordline WL31 and the string selection line SSL, respectively. The first shielding line SL1 is interposed between the wordline WL0 and the ground selection line GSL while the second shielding line SL2 is interposed between the wordline WL31 and the string selection line SSL. The first and second shielding lines, SL1 and SL2 may function to reduce the capacitance-coupling effects between the wordlines WL0 and WL31 and the selection lines GSL and SSL. Embodiments of the present invention are generally described herein by way of example in which a single shielding line is disposed between the wordline WL0 and the ground selection line GSL and a single shielding line is disposed between the wordline WL31 and the string selection line SSL. It will be understood that in accordance with various embodiments of the present invention, one or more shielding lines may be disposed between the wordline WL0 and the ground selection line GSL and/or one or more shielding lines may be disposed between the wordline WL31 and the string selection line SSL.

Voltages applied to the wordlines WL0~WL31, the ground and string selection lines GSL and SSL, and the first and second shielding lines SL1 and SL2, during a programming operation will be described in detail with reference to FIG. 8 below.

Figure 4:
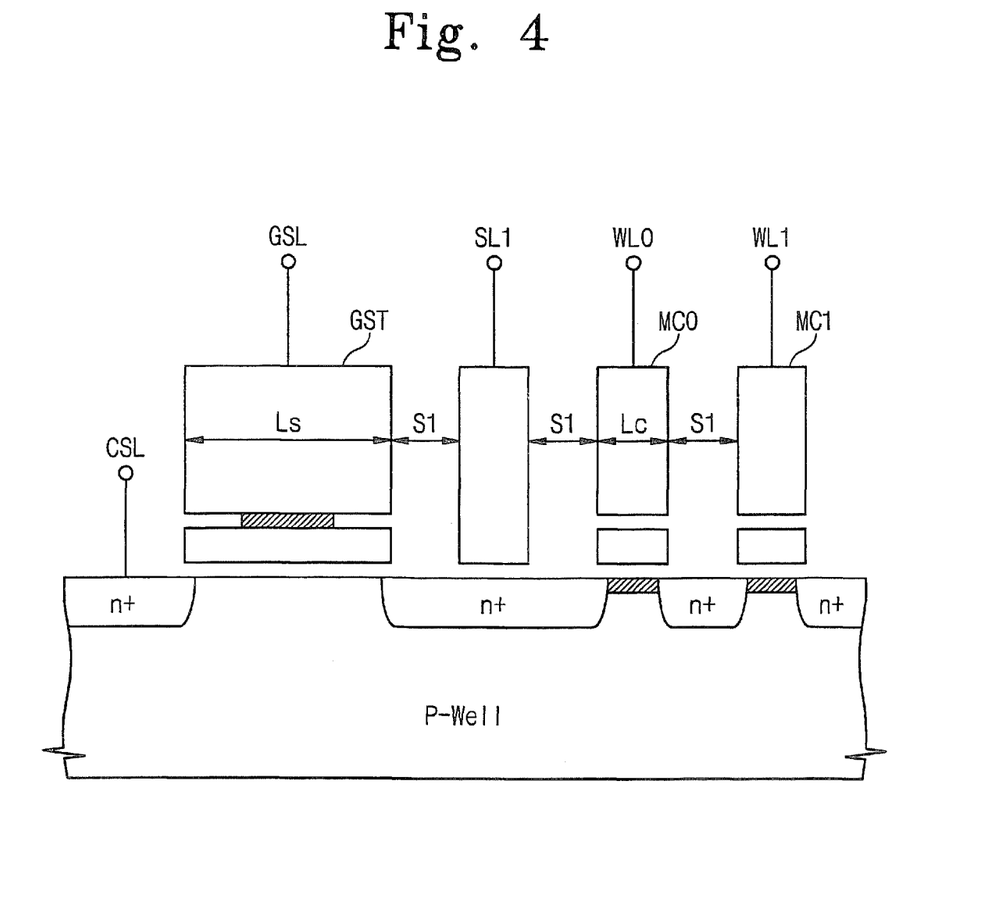
FIG. 4 is a cross-section diagram partially illustrating the cell string of the NAND flash memory device shown in FIG. 3.

FIG. 4 is a cross-section diagram partially illustrating the cell string of the NAND flash memory device shown in FIG. 3. Referring to FIG. 4, a channel length Ls of the ground selection transistor GST is longer than the channel length Lc of the memory cell MC0 or MC1. This feature may reduce the likelihood that a channel voltage of the program-inhibited cell MC0, which has been raised by the self-boosting effect, leaks out through the ground selection transistor GST during the programming operation.

As illustrated in FIG. 4, the first shielding line SL1 is formed on an N+ doped region that is shared by the memory cell MC0 and the ground selection transistor GST. The first shielding line SL1 is made of a conductive material, such as polysilicon or metal. An interval S1 between the adjacent wordlines WL0 and WL1 may be about the same as an interval S1 between the wordline WL0 and the first shielding line SL1 or an interval S1 between the first shielding line SL1 and the ground selection line GSL.

Figure 5:
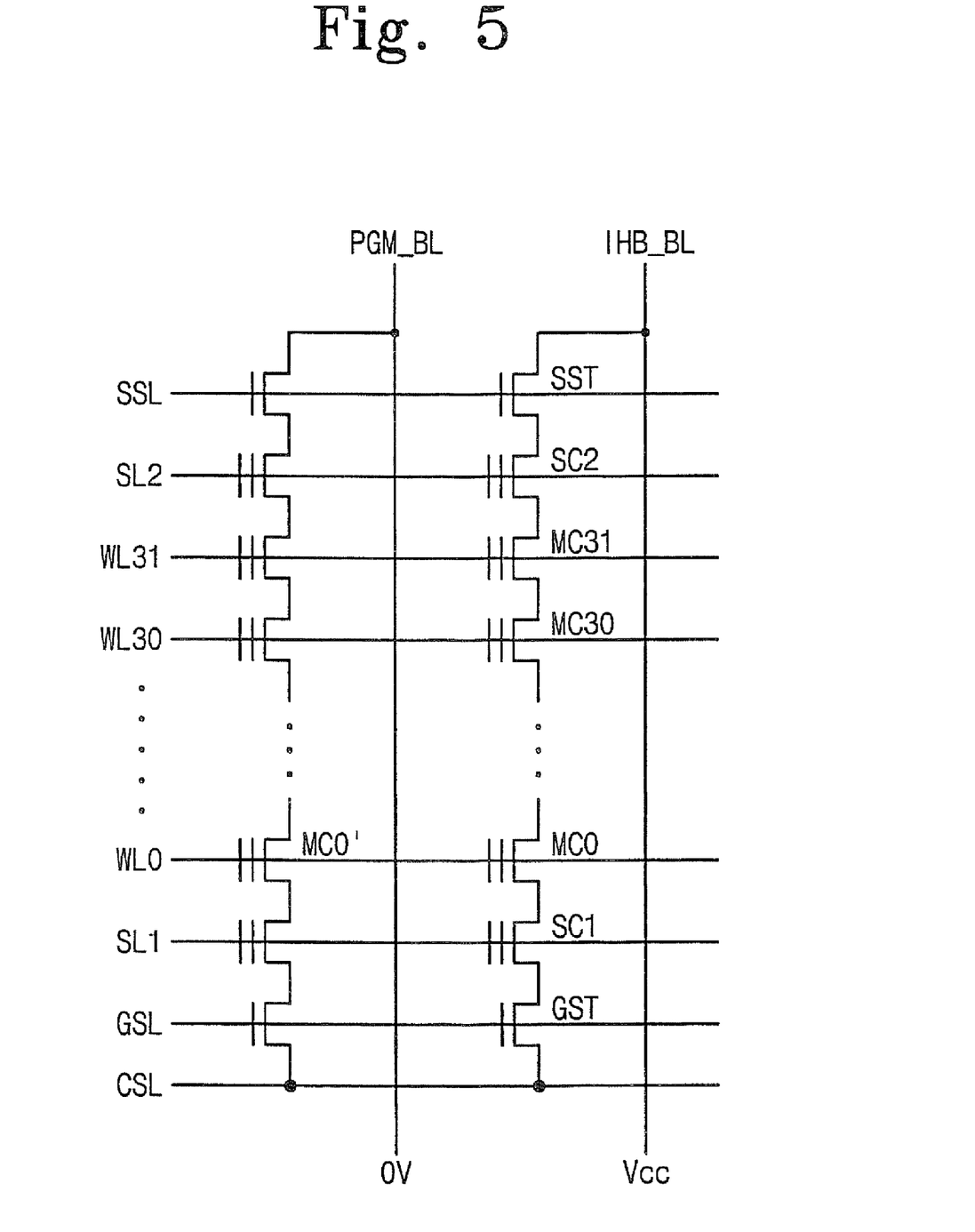
FIG. 5 is a circuit diagram illustrating the structure of a cell string in a NAND flash memory device in accordance with second embodiments of the present invention.

FIG. 5 is a circuit diagram illustrating the structure of a cell string in a NAND flash memory device in accordance with second embodiments of the present invention. As shown in FIG. 5, the cell string of the NAND flash memory device comprises memory cells MC0~MC31, selection transistors GST and SST, and shielding cells SC1 and SC2. The cell string is composed of the ground selection transistor GST, the first shielding cell SC1, the serially connected memory cells MC0~MC31, the second shielding cell SC2, and the string selection transistor SST that are connected in series.

The first shielding cell SC1 is connected between the ground selection transistor GST and the memory cell MC0, receiving a shielding voltage through the first shielding line SL1. During a programming operation, the first shielding cell and line, SC1 and SL1, may function to lessen the capacitance-coupling effect between the wordline WL0 and the ground selection line GSL when the wordline voltage is being applied to the program-inhibited cell MC0.

The second shielding cell SC2 is connected between the string selection transistor SST and the memory cell MC31 so as to receive a shielding voltage through the second shielding line SL2. During the programming operation, the second shielding cell and line, SC2 and SL2, may function to lessen the capacitance-coupling effect between the wordline WL31 and the string selection line SSL when the wordline voltage is being applied to the memory cell MC31.

Voltages applied to the wordlines WL0~WL31, the ground and string selection lines GSL and SSL, and the first and second shielding lines SL1 and SL2, during the programming operation, will be described in detail with reference to FIG. 8 below.

Figure 6:
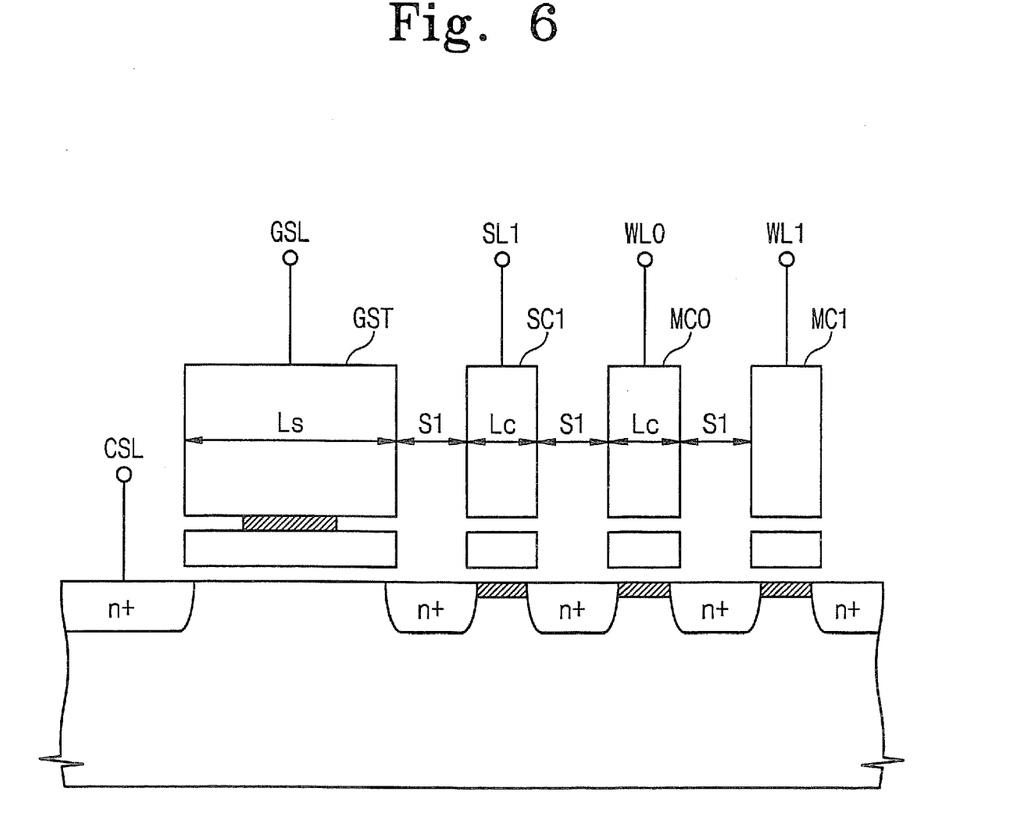
FIG. 6 is a cross-section diagram partially illustrating the cell string of the NAND flash memory device shown in FIG. 5.

FIG. 6 is a cross-section diagram partially illustrating the cell string of the NAND flash memory device shown in FIG. 5. The shielding cell SC is constructed in the same manner as the memory cell MC.

Referring to FIG. 6, the first shielding cell SC1 is arranged between the memory cell MC0 and the ground selection transistor GST, having about the same channel length Lc as the memory cell MC0. An interval S1 between the adjacent wordlines WL0 and WL1 may be about the same as an interval S1 between the wordline WL0 and the first shielding line SL1 or an interval S1 between the first shielding line SL1 and the ground selection line GSL.

Figure 7:
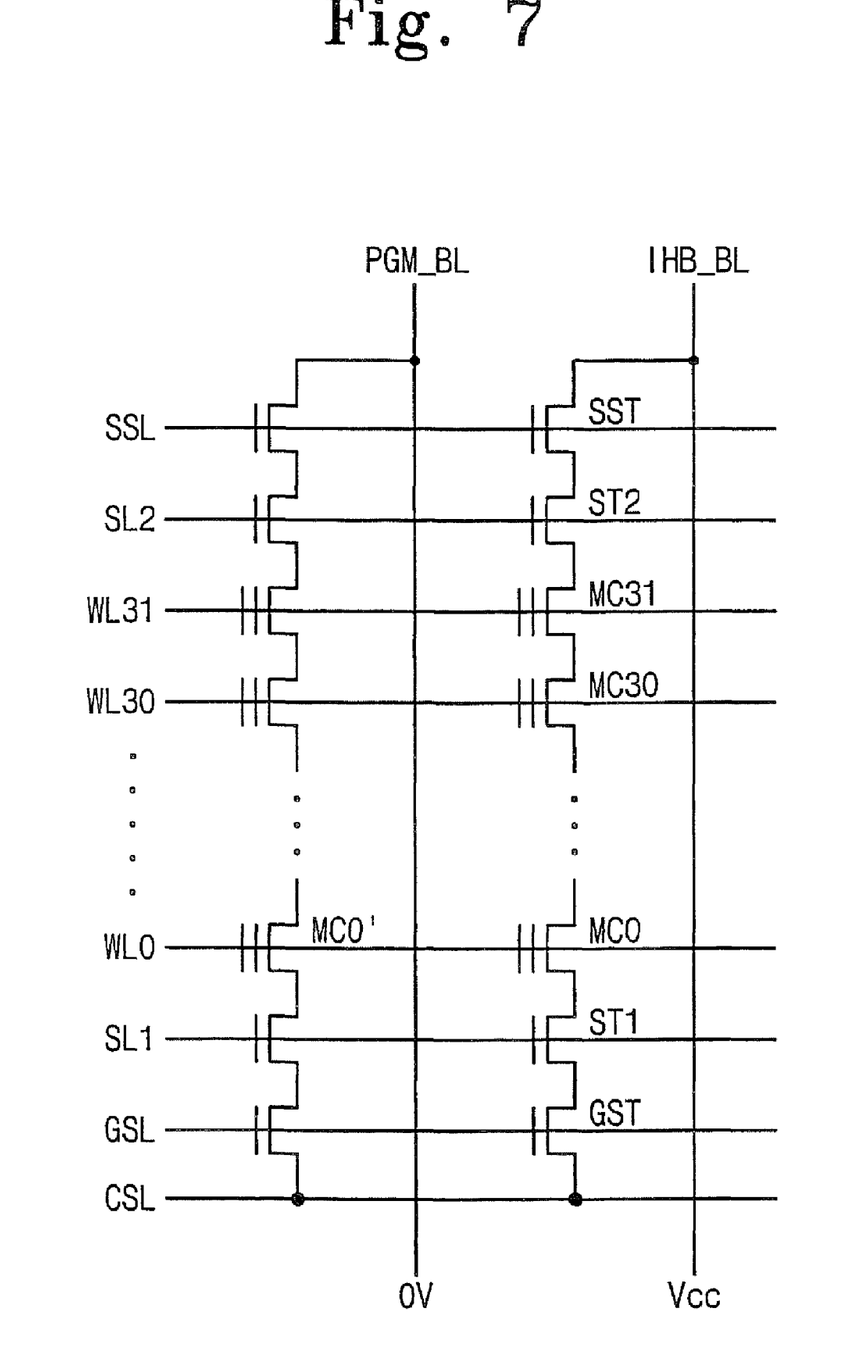
FIG. 7 is a circuit diagram illustrating the structure of cell string in a NAND flash memory device in accordance with third embodiments of the present invention.

FIG. 7 is a circuit diagram illustrating the structure of a cell string in a NAND flash memory device in accordance with third embodiments of the present invention. The cell string of the NAND flash memory device comprises memory cells MC0~MC31, selection transistors GST and SST, and shielding transistors ST1 and ST2. The cell string is composed of the ground selection transistor GST, the first shielding transistor ST1, the serially connected memory cells MC0~MC31, the second shielding transistor ST2, and the string selection transistor SST that are connected in series.

The shielding transistors, ST1 and ST2, may be formed in the same structure as a MOS transistor like the selection transistors GST and SST. The first shielding transistor ST1 is disposed between the ground selection transistor GST and the memory cell MC0 and receives a shielding voltage through the first shielding line SL1. The second shielding transistor ST2 is connected between the string selection transistor SST and the memory cell MC31 and receives a shielding voltage through the second shielding line SL2. During a programming operation, the shielding transistors, ST1 and ST2, may function to lessen the capacitance-coupling effect between the wordlines WL0 and WL31 and the ground selection lines GSL and SSL, respectively, when the wordline voltages are being applied to the memory cells MC0~MC31.

Voltages applied to the wordlines WL0~WL31, the ground and string selection lines GSL and SSL, and the first and second shielding lines SL1 and SL2 during the programming operation will be described in detail with reference to FIG. 8 below.

Figure 8:
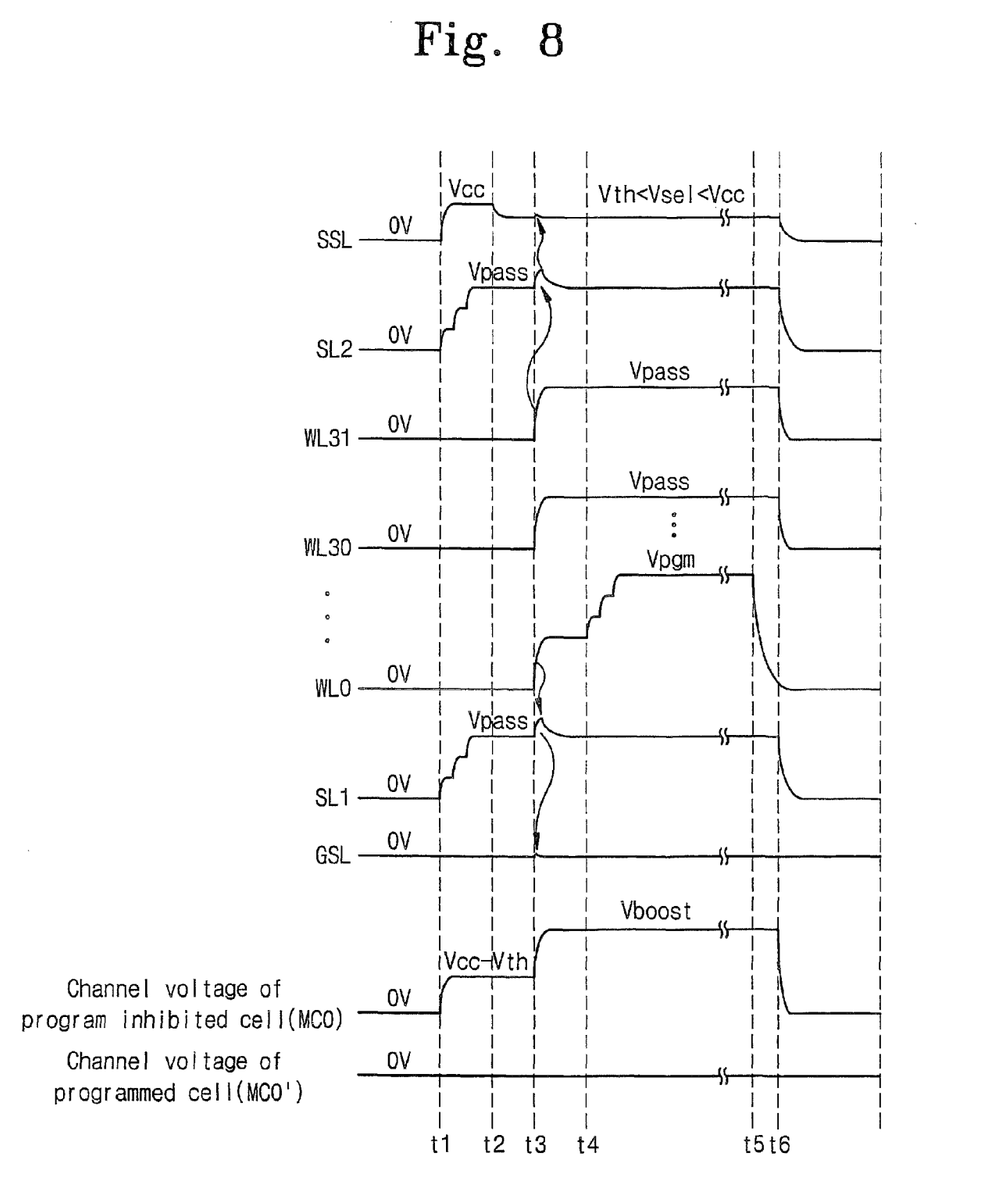
FIG. 8 is a timing diagram showing voltages applied to wordlines, selection lines, and shielding lines during a programming operation in the NAND flash memory devices according to various embodiments the present invention.

FIG. 8 is a timing diagram showing voltages applied to the wordlines WL0~WL31, the selection lines GSL and SSL, and the shielding lines SL1 and SL2 during a programming operation in a NAND flash memory device according to some embodiments of the present invention.

First, when the programming operation begins, the bitline PGM_BL of the program cell MC0' is driven to 0V while the bitline IHB_BL of the program-inhibited cell MC0 is driven to the power supply voltage Vcc.

The power source voltage Vcc is applied to the string selection line SSL at time point $t_1$. At this time, a channel voltage of the program-inhibited cell MC0 becomes Vcc−Vth. Here, Vth represents a threshold voltage of the string selection transistor SST. As a result, the string selection transistor SST cuts off.

In addition, when the power source voltage Vcc is supplied to the string selection line SSL, the shielding voltage is applied to the first and second shielding lines SL1 and SL2.

As illustrated in FIG. 8, the shielding voltage is a step voltage that increases up to the level of the pass voltage Vpass with predetermined voltage gaps. The reason for applying such a step voltage to the shielding lines SL1 and SL2 is to reduce the capacitance-coupling effects between the shielding lines SL1 and SL2 and the selection lines GSL and SSL, when the shielding voltage is active. While FIG. 8 shows the shielding voltage rising up to the level of the pass voltage Vpass, this is merely one example according to some embodiments of the present invention. The shielding voltage may be established at a level higher than 0V but lower than the pass voltage Vpass, without being limited to the step voltage pattern or waveform.

At time point $t_2$, the voltage being applied to the string selection line SSL transitions to a voltage Vsel that is greater than the threshold voltage Vth but less than the power source voltage Vcc, which forces the string selection transistor SST to be driven heavily into a cut-off state.

At time point $t_3$, the pass voltage Vpass is applied to the wordlines WL0~WL31. During this operation, a channel voltage of the program-inhibited cell MC0 increases to a boosted voltage level Vboost. As illustrated in FIG. 8, when the pass voltage Vpass is being applied to the wordlines WL0~WL31, voltages on the first and second shielding lines SL1 and SL2 are raised by line capacitance-coupling effects generated between the wordline WL0 and the first shielding line SL1, and between the wordline WL31 and the second shielding line SL2, respectively. Along with the voltage elevation on the first and second shielding lines SL1 and SL2, there are also generated the line capacitance-coupling effects between the first shielding line SL1 and the ground selection line GSL, and between the second shielding line SL2 and the string selection line SSL. The line capacitance-coupling effect increases voltages on the ground and string selection lines GSL and SSL.

The voltages of the ground and string selection lines GSL and SSL are relatively lower than the voltages, which increase as shown in FIG. 2, on the ground and string selection lines. This is because the one or more shielding lines disposed between the wordline and the selection line may act to reduce the line capacitance-coupling effect therein.

It is assumed that if the capacitance between the wordline WL0 and the ground selection line GSL is $C_{CP}$, the whole capacitance between the ground selection line GSL and the ground terminal is $C_{GSL}$, and $C_{GSL}=15C_{CP}$. And, it is assumed that a voltage between the wordline WL0 and the ground selection voltage GSL is $V_{CP}$, and a voltage between the ground selection line GSL and the ground terminal is $V_{GSL}$.

In a conventional device, the voltage $V_{GSL}$ of the ground selection line GSL, which increases when the wordline voltage $V_{W1}$ is being applied to the wordline WL0, is given by the following equations. And, the charge quantity $Q_{CP}$ of the wordline and the charge quantity $Q_{GSL}$ of the ground selection line are also as follows.

$$Q_{CP}=Q_{GSL} \tag{A}$$

$$C_{CP}V_{CP}=C_{GSL}V_{GSL} \tag{B}$$

$$V_{WL}=V_{CP}+V_{GSL} \tag{C}$$

Summarizing the equation (B) for $V_{CP}$ and then putting the result into the equation (C), it results in Equation 1 as follows.

$$V_{GSL} = \frac{C_{CP}}{C_{CP} + C_{GSL}} V_{WL} \quad \text{[Equation 1]}$$

If the following substitutions are made in Equation 1: $C_{GSL}=15C_{CP}$ and $V_{WL}=V\text{pass}=8V$, then Equation 1 produces the following result: $V_{GSL}=0.063V_{WL}=0.5V$. In a conventional device, when the pass voltage Vpass is being applied to the wordlines WL0~WL31, the voltage on the ground selection lines GSL instantly rises by about 0.5V due to the line capacitance-coupling effect. Thus, the ground selection transistor GST is turned on as it is unable to maintain its cut-off state. During this operation, the channel voltage Vboost of the program-inhibited cell MC0, which has been raised by the self-boosting effect, leaks out through the ground selection transistor GST.

Meanwhile, it is assumed that the capacitance between the wordline WL0 and the first shielding line SL1 is $C_{SP}$, the whole capacitance between the first shielding line SL1 and the ground terminal is $C_{SL}$, and $C_{SL}=15C_{SP}$. The voltage $V_{SL1}$ of the first shielding line SL1, which increases by the line capacitance-coupling effect, is given by the following Equation 2:

$$V_{SL1} = \frac{C_{SP}}{C_{SP} + C_{SL}} V_{WL} \quad \text{[Equation 2]}$$

If the following substitutions are made in Equation 2: $C_{SP}=2C_{CP}$ and $C_{SL}=7C_{CP}$, then Equation 2 produces the following result: $V_{SL1}=0.22V_{WL}$.

And, it is assumed that capacitance between the first shielding line SL1 and the ground selection line GSL is $C_{SP}$, the whole capacitance between the ground selection line GSL and the ground terminal is $C_{GSL}$, and $C_{GSL}=15C_{SP}$.

The voltage $V_{GSL}$ of the ground selection line GSL, which increases by the line capacitance-coupling effect, is given by the following Equation 3:

$$V_{GSL} = \frac{C_{SP}}{C_{SP} + C_{GSL}} V_{SL1} = \frac{C_{SP}}{C_{SP} + C_{GSL}} 0.22 V_{WL} \quad \text{[Equation 3]}$$

If the following substitutions are made in Equation 3: $C_{SP}=2C_{CP}$ and $C_{SL}=15C_{CP}$, then Equation 3 produces the following result: $V_{GSL}=0.12*0.22V_{WL}=0.26V_{WL}$. Thus, according to some embodiments of the present invention, the increased voltage of the ground selection line GSL is about 0.21V when a pass voltage Vpass of about 8V is applied to the wordline WL0.

As such, a NAND flash memory device, according to some embodiments of the present invention, includes the shielding lines between the wordlines and the selection lines, reducing the selection-line voltages that increase the line capacitance-coupling effects therein when the pass voltage is being applied to the wordlines during the programming operation.

Next, at time point $t_4$, the program voltage Vpgm is applied to the selected wordline WL0. The program voltage Vpgm is a step voltage that increases with predetermined voltage gaps. The step voltage is provided to reduce or prevent increases in the voltage of the ground selection line GSL due to the line capacitance-coupling effect.

If the program voltage Vpgm is applied to the selected wordline WL0, the program cell MC0' is programmed by the F-N tunneling mechanism, while the program-inhibited cell MC0 is not programmed because there is no generation of the F-N tunneling effect.

As described with reference to FIG. 8, a NAND flash memory device, according to some embodiments of the present invention, includes shielding lines between the wordlines and the selection lines, which may prevent or reduce abrupt increases in the selection-line voltages due to the line capacitance-coupling effects therein during the programming operation.

Figure 9:
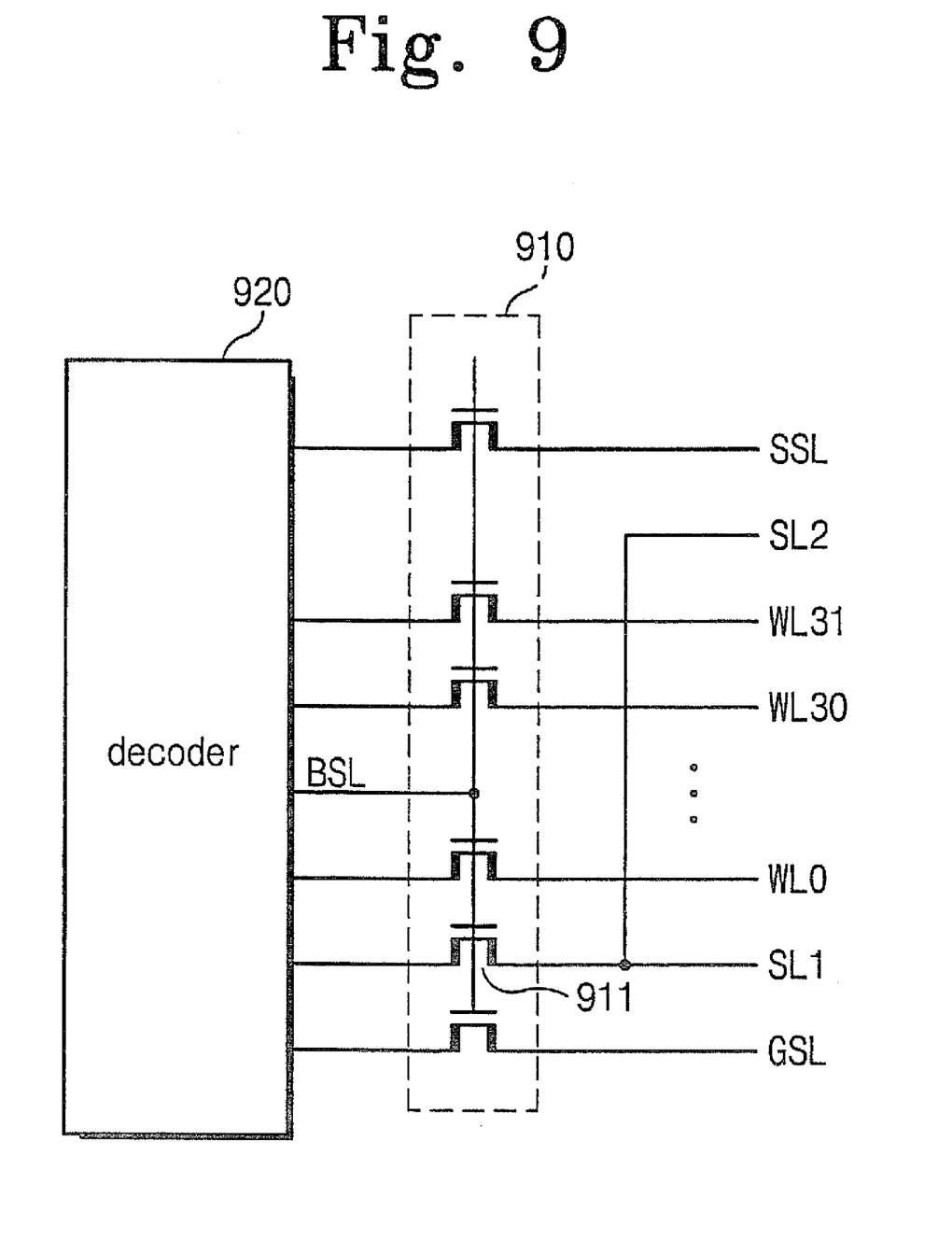
FIG. 9 is a circuit diagram illustrating operation of a plurality of shielding lines by a single driver in a NAND flash memory device according to some embodiments of the present invention.

FIG. 9 is a circuit diagram illustrating operation of the plurality of shielding lines by a single driver in a NAND flash memory device according to some embodiments of the invention. The wordlines WL0~WL31, the selection lines SSL and GSL, and the shielding lines SL1 and SL2, illustrated with their voltage patterns in FIG. 9, correspond to the lines in the cell strings shown in FIGS. 3, 5, and 7.

Referring to FIG. 9, the wordlines WL0~WL31, the selection lines SSL and GSL, and the shielding lines SL1 and SL2 are connected to a block selection circuit (or decoder) 920. The block selection circuit 920 comprises a plurality of MOS transistors. The MOS transistors are each connected to the lines and turned on or off in response to a signal on a block selection line BSL. The MOS transistors may comprise transistors that can handle high voltages (e.g., Vpgm, Vpass, etc.) so as to transfer the high voltages from the decoder 920 to the lines of the cell string.

From FIG. 9, it can be seen that the first and second shielding lines, SL1 and SL2, are driven by a single MOS transistor 911. This is because the first and second shielding lines, SL1 and SL2, are designed to be supplied with the same shielding voltage at the same time. Here, the MOS transistor 911 acts as a driver for providing the shielding voltage from the decoder 920 to the first and second shielding lines SL1 and SL2.

Although not shown in FIG. 9, a NAND flash memory device with multiple memory blocks may use the single driver 911 for transferring the same shielding voltage to multiple shielding lines arranged in the memory blocks. Thus, the NAND flash memory device is able to operate multiple shielding lines by means of the single driver, which is helpful for avoiding increases in chip size even with the addition of the shielding lines.

As described above, a NAND flash memory device, according to some embodiments of the present invention, may be configured to have the shielding lines between the wordlines and selection lines, thereby preventing or reducing leaks in the channel voltage of the program-inhibited cell during the programming operation. Thus, some embodiments of the present invention may avoid the inadvertent programming result in the program-inhibited cell, which may be caused by the line capacitance-coupling effect during a programming operation.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A programming method of flash memory, comprising:
    applying a shielding voltage to at least one shielding line, which is interposed between a plurality of wordlines and a selection line and operable to reduce capacitance-coupling between the wordline and the selection line during the programming operation;
    applying a pass voltage to at least one of the wordlines;

applying a program voltage to memory cells through one of the wordlines;

wherein the shielding voltage is applied before the pass voltage is applied.

2. The programming method as set forth in claim 1, wherein the shielding voltage is a step voltage.

3. The programming method as set forth in claim 1, wherein the program voltage is applied to one of the wordlines when the shielding voltage is about equal to the pass voltage.

4. The programming method as set forth in claim 1, wherein the shielding voltage is applied to the shielding line when a selection voltage is supplied to the selection line.

5. The programming method as set forth in claim 1, wherein an interval between adjacent ones of the plurality of wordlines is about a same as an interval between the wordline and the shielding line, and about a same as an interval between the shielding line and the selection line.

6. The programming method as set forth in claim 1, wherein the selection line is a string selection line.

7. The programming method as set forth in claim 1, wherein the selection line is a ground selection line.

8. The programming method as set forth in claim 1, wherein the shielding line comprises a conductive material.

9. A programming method of a flash memory, comprising:

applying a shielding voltage to at least one shielding line interposed between a plurality of wordlines and a selection line; and applying a program voltage to memory cells through one of the wordlines;

wherein the shielding voltage is a step voltage.

10. The programming method as set forth in claim 1, wherein the shielding voltage is between about 0V and the pass voltage.

* * * * *